United States Patent
Wakabayashi

(10) Patent No.: US 10,292,267 B2
(45) Date of Patent: May 14, 2019

(54) JOINING PART AND BOARD UNIT

(71) Applicant: FUJITSU LIMITED, Kawasaki-shi, Kanagawa (JP)

(72) Inventor: Akihiro Wakabayashi, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/818,204

(22) Filed: Nov. 20, 2017

(65) Prior Publication Data
US 2018/0153040 A1 May 31, 2018

(30) Foreign Application Priority Data
Nov. 29, 2016 (JP) .................. 2016-231749

(51) Int. Cl.
| | | |
|---|---|---|
| H05K 1/11 | (2006.01) | |
| H05K 1/14 | (2006.01) | |
| H05K 1/18 | (2006.01) | |
| H05K 3/34 | (2006.01) | |

(52) U.S. Cl.
CPC ............ *H05K 1/144* (2013.01); *H05K 1/115* (2013.01); *H05K 1/181* (2013.01); *H05K 3/3468* (2013.01); *H05K 2201/042* (2013.01); *H05K 2201/10295* (2013.01); *H05K 2201/10318* (2013.01); *H05K 2201/10409* (2013.01); *H05K 2201/10545* (2013.01); *H05K 2201/10734* (2013.01)

(58) Field of Classification Search
None
See application file for complete search history.

(56) References Cited

U.S. PATENT DOCUMENTS

| | | | | |
|---|---|---|---|---|
| 2,936,015 A | * | 5/1960 | Rapata ................. | F16B 5/0233 174/138 D |
| 3,148,356 A | * | 9/1964 | Hedden, Jr. .......... | H01R 12/526 174/260 |
| 5,018,982 A | * | 5/1991 | Speraw ................. | H05K 7/142 174/138 D |
| 5,075,821 A | * | 12/1991 | McDonnal ............ | H02M 3/00 165/185 |
| 7,085,146 B2 | * | 8/2006 | Pitzele ................. | H05K 3/3447 29/852 |
| 9,119,327 B2 | * | 8/2015 | Albrecht, III ........ | H05K 1/0203 |

(Continued)

FOREIGN PATENT DOCUMENTS

| | | |
|---|---|---|
| JP | 61-173145 U | 10/1986 |
| JP | 2007-115846 | 5/2007 |
| JP | 2012-028624 | 2/2012 |

*Primary Examiner* — Dimary S Lopez Cruz
(74) *Attorney, Agent, or Firm* — Fujitsu Patent Center

(57) ABSTRACT

A joining part disposed between a first board and a second board and joined to the first board and the second board, the joining part being insertion-mounted by inserting at least one of one end and a remaining end thereof into a through hole formed in at least one of the first board and the second board, the joining part includes a body portion disposed between the first board and the second board and having a width larger than a width of the through hole, and an insertion portion having a width smaller than the width of the through hole and inserted into the through hole, wherein, in a step formed by the body portion and the insertion portion, a notch opened to a side surface of the body portion is formed in a step surface that crosses the side surface of the body portion.

11 Claims, 11 Drawing Sheets

(56) References Cited

U.S. PATENT DOCUMENTS

| | | | |
|---|---|---|---|
| 9,629,245 B2* | 4/2017 | Kohn | H05K 3/3447 |
| 2010/0122458 A1* | 5/2010 | Woods, Jr. | H01R 12/58 29/884 |
| 2016/0278209 A1* | 9/2016 | Perez-Uria | H01R 4/024 |

* cited by examiner

JOINING PART AND BOARD UNIT

CROSS-REFERENCE TO RELATED APPLICATION

This application is based upon and claims the benefit of priority of the prior Japanese Patent Application No. 2016-231749, filed on Nov. 29, 2016, the entire contents of which are incorporated herein by reference.

FIELD

The embodiments discussed herein are related to a joining part and a board unit.

BACKGROUND

There is known a technique of stacking a plurality of boards one above another by insertion-mounting a joining part into through holes formed in the boards. In this case, it is known to use a joining part in which the width of a body portion thereof disposed between the boards is larger than the width of the through holes formed in the boards. In addition, it has been known that, in a case where a plurality of boards is stacked one above another by surface mounting a joining part to the boards, a notch is formed in the joining surfaces of the joining part to be joined with the boards.

In a case where insertion-mounting is performed using a joining part having a body portion which is disposed between the boards and has a width larger than the width of the through holes formed in the boards, voids may be generated when joining members are embedded in the through holes. When the voids are generated, the quality of joining is deteriorated.

The followings are reference documents.
[Document 1] Japanese Laid-open Utility Model Publication No. 61-173145 and
[Document 2] Japanese Laid-open Patent Publication No. 2007-115846 and
[Document 3] Japanese Laid-open Patent Publication No. 2012-028624.

SUMMARY

According to an aspect of the invention, a joining part disposed between a first board and a second board and joined to the first board and the second board, the joining part being insertion-mounted by inserting at least one of one end and a remaining end thereof into a through hole formed in at least one of the first board and the second board, the joining part includes a body portion disposed between the first board and the second board and having a width larger than a width of the through hole, and an insertion portion having a width smaller than the width of the through hole and inserted into the through hole, wherein, in a step formed by the body portion and the insertion portion, a notch opened to a side surface of the body portion is formed in a step surface that crosses the side surface of the body portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, examples disclosed herein will be described with reference to the accompanying drawings.

Example 1

Figure 1:
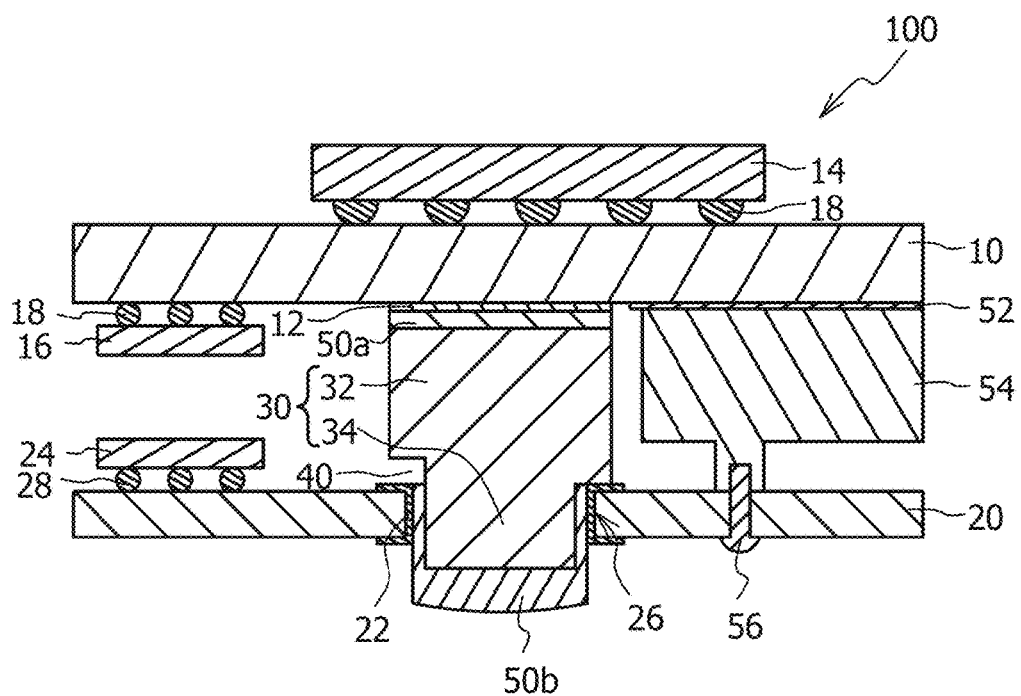
FIG. 1 is a cross-sectional view of a board unit according to Example 1.

FIG. 1 is a cross-sectional view of a board unit according to Example 1. As illustrated in FIG. 1, the board unit 100 of Example 1 includes a board 10, a board 20, and a joining part 30. The board 10 and the board 20 are, for example, printed circuit boards. The joining part 30 is provided between the board 10 and the board 20 and is joined to the board 10 and the board 20. Thus, the board 10 and the board 20 are stacked one above another.

The joining part 30 is formed of, for example, a metal such as, for example, copper. One end of the joining part 30 is mounted on an electrode 12, which is formed on the lower surface of the board 10, by a solder 50a via a surface mount technology (SMT). The other end of the joining part 30 is mounted on an electrode 22, which is formed in a through hole 26 formed in the board 20, by a solder 50b via an insertion mount technology (IMT). Thus, the board 10 and the board 20 are electrically connected to each other via the joining part 30.

Between the board 10 and the board 20, a support body 54 is installed so as to come into contact with the lower surface of the board 10 via an insulator 52 and to be fixedly screwed to the upper surface of the board 20 by a screw 56. Because stability is poor when the board 10 and the board 20 are supported only by the joining part 30, the support body 54 is installed in order to ensure good stability. The support body 54 may be strong in order to stably support the board 10 and the board 20, and is formed of, for example, a metal such as, for example, copper. Therefore, in order to prevent the board 10 and the support body 54 from being electrically connected to each other, the insulator 52 is provided between the board 10 and the support body 54. The insulator 52 is, for example, an oxide silicon layer.

An electronic element 14 is mounted on the upper surface of the board 10 by a solder 18, and an electronic element 16 is mounted on the lower surface of the board 10 by a solder 18. An electronic element 24 is mounted on the upper surface of the board 10 by a solder 28. Because the board 10 and the board 20 are electrically connected to each other, the electronic element 14, the electronic element 16, and the electronic element 24 are, for example, electrically connected to one another. In addition, in FIG. 1, for brief illustration, although a case where one electronic element is mounted on each of the upper surface and the lower surface of the board 10 and the upper surface of the board 20 is illustrated by way of example, a plurality of electronic elements may be mounted. In addition, an electronic element may be mounted on the lower surface of the board 20.

The joining part 30 includes a body portion 32, which is disposed between the board 10 and the board 20 and is not inserted into the through hole 26 in the board 20, and an insertion portion 34, which is inserted into the through hole 26 in the board 20. That is, in the joining part 30, the body portion 32 is joined to the electrode 12, which is provided on the lower surface of the board 10, by the solder 50a, and the insertion portion 34 is joined to the electrode 22, which is provided in the through hole 26 in the board 20, by the solder 50b. The insertion portion 34 has a width smaller than that of the through hole 26, whereas the body portion 32 has a width larger than that of the through hole 26. The body portion 32 is in contact with the upper surface of the board 20 via, for example, the electrode 22 because it has a width larger than that of the through hole 26. The distance between the board 10 and the board 20 and the length of the body portion 32 are substantially the same. In addition, the solder 50a and the solder 50b may be a low melting point solder in order to prevent heating generated during soldering from having a negative effect on the electronic element 14, the electronic element 16, and the electron element 24. For example, the solder 50a and the solder 50b may be a solder alloy having tin-bismuth (Sn—Bi) as a main component.

Figure 2:
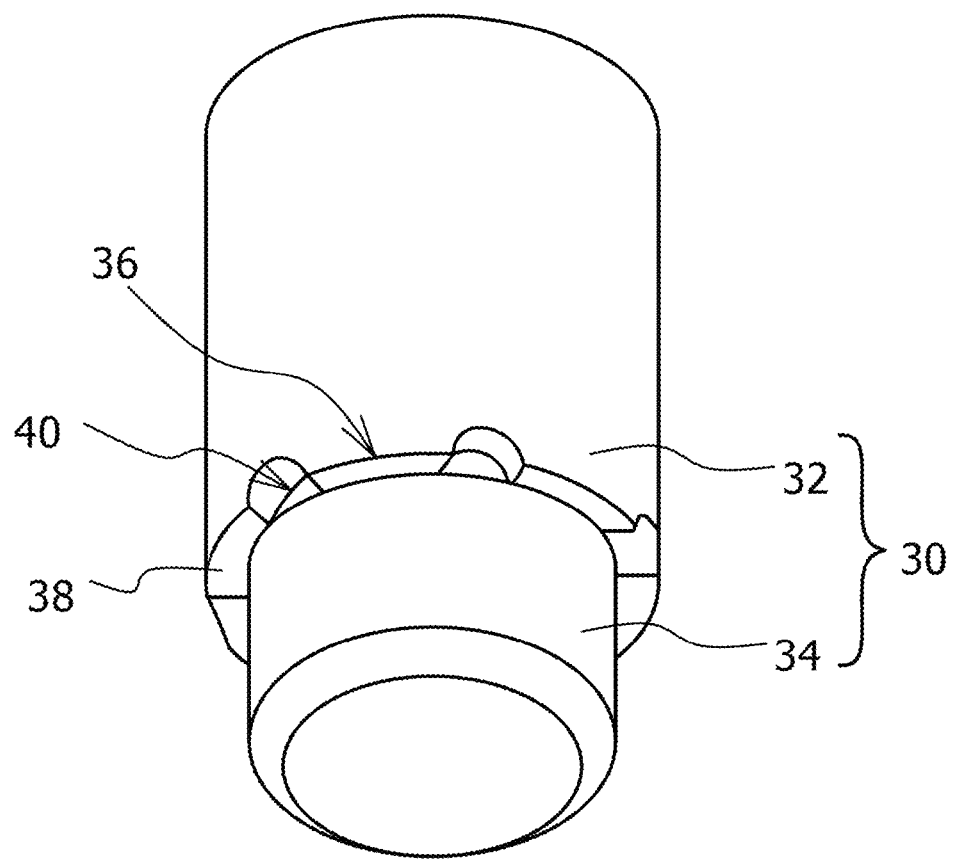
FIG. 2 is a perspective view of a joining part provided in the board unit according to Example 1.

FIG. 2 is a perspective view of the joining part provided in the board unit according to Example 1. As illustrated in FIG. 2, the joining part 30 has a substantially cylindrical shape. That is, the body portion 32 and the insertion portion 34 have a substantially cylindrical shape. The insertion portion 34 has a substantially cylindrical shape having a diameter smaller than that of the body portion 32 because it has a width smaller than that of the body portion 32. Here, the substantially cylindrical shape includes an oval shape, or a round column shape with rounded corners, in addition to a perfect circular shape.

Because the body portion 32 and the insertion portion 34 have different diameters, a step 36 is formed. A step surface 38 of the step 36, which crosses the side surface of the body portion 32, is formed with a plurality of notches 40, which is opened to the side surface of the body portion 32. The plurality of notches 40 is formed, for example, at regular intervals. The notches 40 are formed to extend from one end of the step surface 38 on the side of the side surface of the body portion 32 to the other end of the step surface 38 on the side of the side surface of the insertion portion 34. The notches 40 have a substantially semicircular shape when the body portion 32 is viewed from the lateral side. Here, the substantially semicircular shape is not limited to a perfect semicircular shape, but includes, for example, a circular arc that is longer or shorter than a semicircular arc, and an elliptical arc. The length of the joining part 30 (the total length of the body portion 32 and the insertion portion 34) is, for example, 10 mm, and the depth of the notches 40 is in the range of, for example, 0.1 mm to 1 mm.

Figure 3:
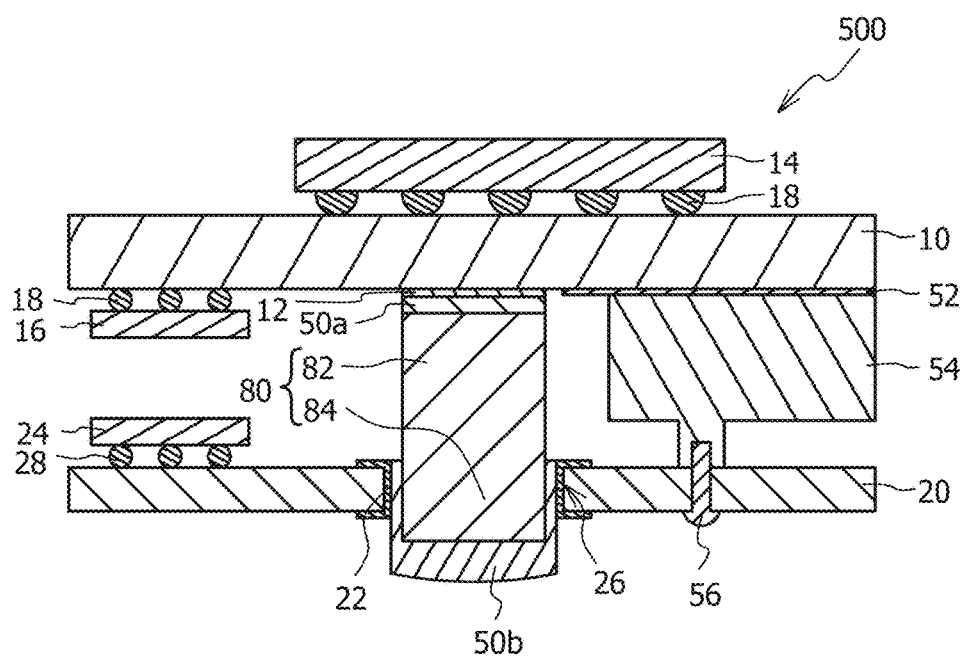
FIG. 3 is a cross-sectional view of a board unit according to Comparative Example 1.

Here, prior to describing the effects of the board unit 100 of Example 1, a board unit of comparative examples will be described first. FIG. 3 is a cross-sectional view of a board unit according to Comparative Example 1. As illustrated in FIG. 3, in a board unit 500 of Comparative Example 1, a joining part 80 has a substantially cylindrical shape, the width of which is constant from one end to the other end thereof. That is, a body portion 82, which is disposed between the board 10 and the board 20 and is not inserted into the through hole 26 in the board 20, and an insertion portion 84, which is inserted into the through hole 26 in the board 20, have the same width. The other configurations are the same as those of Example 1, and thus a description thereof will be omitted.

Figure 4A:
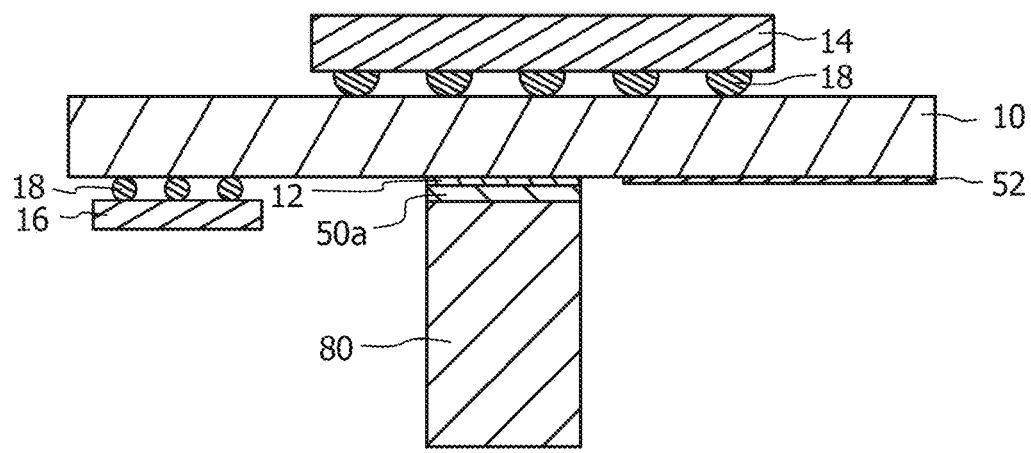
FIGS. 4A and 4B are cross-sectional views illustrating a method of manufacturing the board unit according to Comparative Example 1.
Figure 4B:
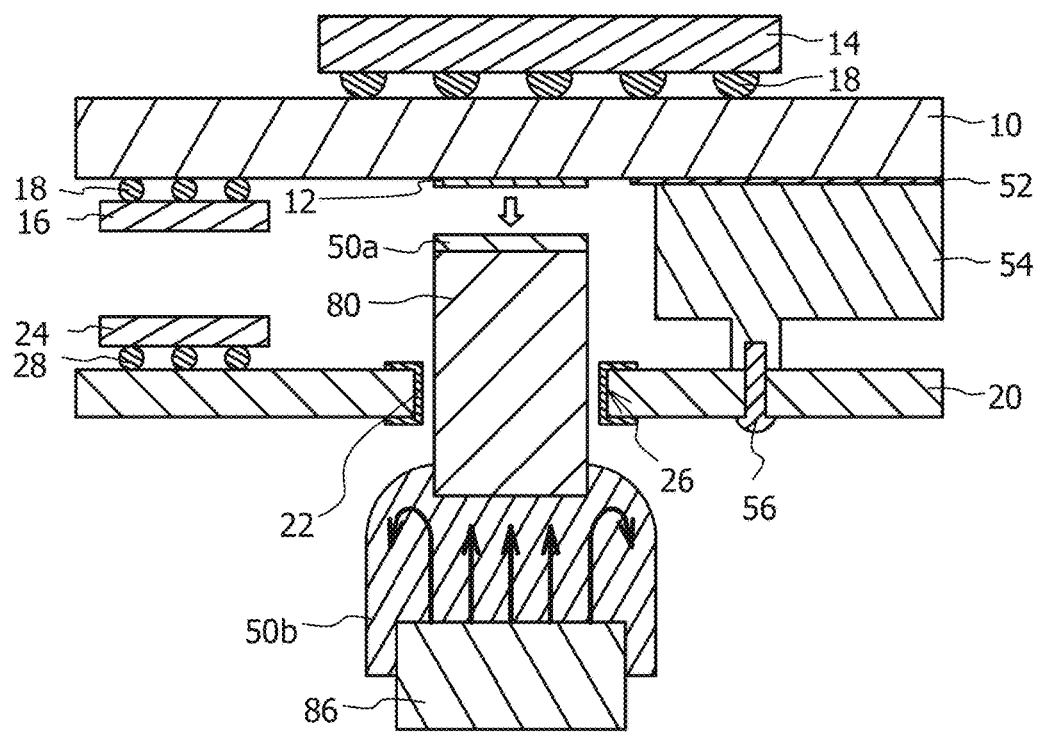

Next, problems that occur in the board unit 500 of Comparative Example 1 will be described. FIGS. 4A and 4B are cross-sectional views illustrating a method of manufacturing the board unit according to Comparative Example 1. As illustrated in FIG. 4A, the joining part 80 is soldered to the electrode 12, which is provided on the lower surface of the board 10, using a solder 50a. As illustrated in FIG. 4B, after the support body 54 is attached between the board 10 and the board 20, the joining part 80 is soldered to the electrode 22, which is provided in the through hole 26 in the board 20, using the solder 50b. For example, soldering is performed by jetting the solder 50b from a nozzle 86 using, for example, a flow method. At this time, when the solder 50a is a low melting point solder, which is formed of the same material as and has the same melting point as the solder 50b, the solder 50a may be melt in the soldering process of the solder 50b, whereby the joining part 80 may be separated from the board 10.

In addition, in order to suppress the joining part 80 from being separated from the board 10, it is conceivable to use, for the solder 50a, a high melting point solder having a melting point higher than that of the solder 50b. However, it is difficult to use the high melting point solder for the solder 50a in consideration of the heat resistance of, for example, the electronic element 14 mounted on the board 10. Although it is conceivable to locally set only the solder 50a, which is formed of a high melting point solder, to a high temperature so as not to have an effect on, for example, the electronic component 14, it is impractical in consideration of a positional relationship between, for example, the electronic element 14 and the joining part 80 or an increase in manufacturing costs due to an increased number of manufacturing processes. In addition, it is also conceivable to prevent the separation of the joining part 80 from the board 10 by performing the manufacturing process in FIG. 4B by inverting the board 10 to the lower side and inverting the board 20 to the upper side. However, in this case, a flow-type soldering may not be used, and it is currently difficult to perform insertion-mounting by a method other than the flow method.

Figure 5A:
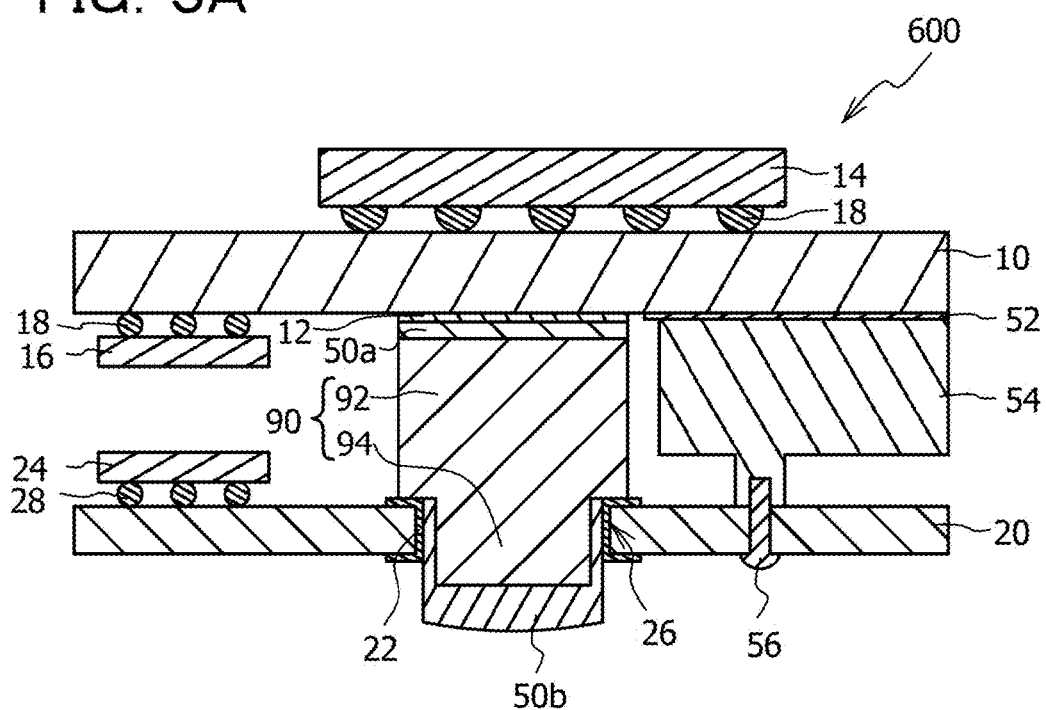
FIG. 5A is a cross-sectional view of a board unit according to Comparative Example 2.
Figure 5B:
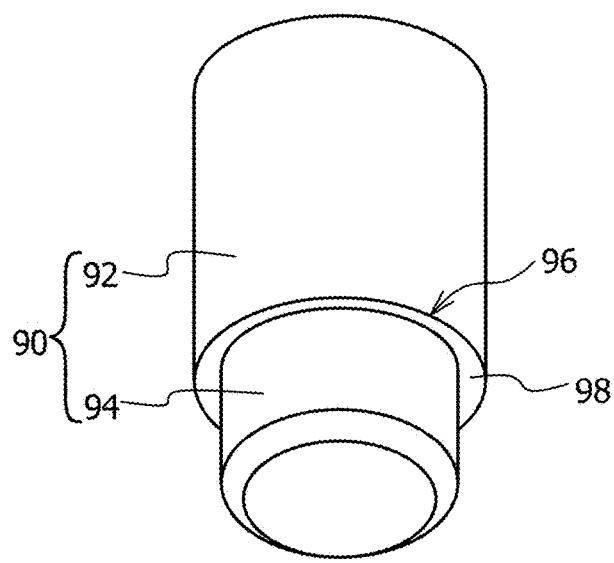
FIG. 5B is a perspective view of a joining part provided in the board unit according to Comparative Example 2.

FIG. 5A is a cross-sectional view of a board unit according to Comparative Example 2, and FIG. 5B is a perspective view of a joining part provided in the board unit according to Comparative Example 2. As illustrated in FIGS. 5A and 5B, in the board unit 600 of Comparative Example 2 a body portion 92 of the joining part 90, which is not inserted into the through hole 26 in the board 20, has a width larger than that of the through hole 26, as in Example 1. An insertion portion 94, which is inserted into the through hole 26, has a width smaller than that of the body portion 92, and a step 96 is formed by the body portion 92 and the insertion portion 94. However, unlike Example 1, no notch is formed in the step surface 98 of the step 96. The other configurations are the same as those in Example 1, and thus a description thereof will be omitted.

The board unit 600 of Comparative Example 2 is manufactured by the same method as the method described above with reference to FIGS. 4A and 4B. In the board unit 500 of Comparative Example 1, the joining part 80 may be separated from the board 10 in the manufacturing process of FIG. 4B. However, in the board unit 600 of Comparative Example 2, because the width of the body portion 92 is larger than the width of the through hole 26, it is possible to suppress the joining part 90 from being separated from the board 10. However, because the body portion 92 covers and blocks the entire through hole 26, in the manufacturing process of FIG. 4B, air permeability is deteriorated when introducing the solder 50b into the through hole 26, and therefore, voids are likely to be generated in the solder 50b.

Figure 6:
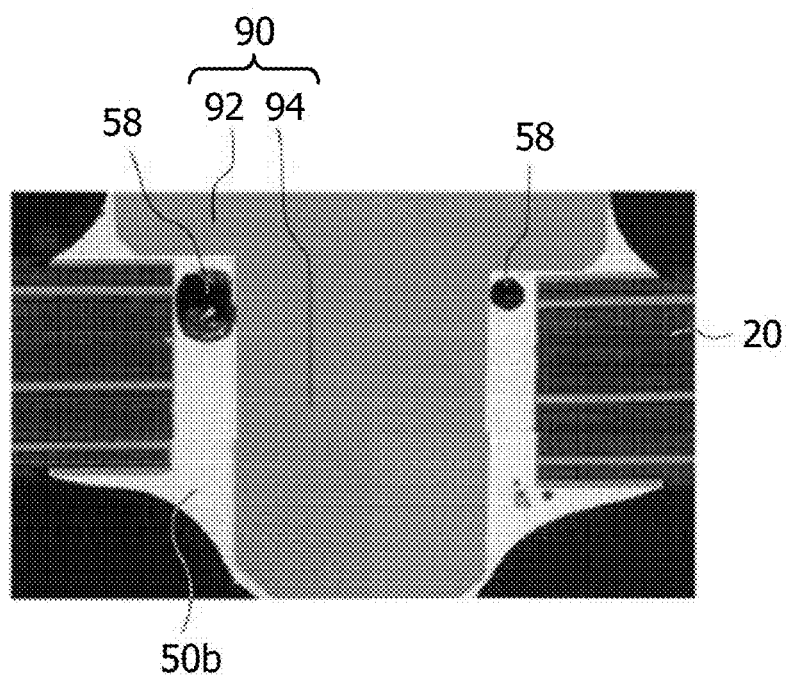
FIG. 6 is a scanning electron microscope (SEM) image in the vicinity of the joining part of the board unit according to Comparative Example 2.

FIG. 6 is a scanning electron microscope (SEM) image in the vicinity of the joining part of the board unit according to Comparative Example 2. As illustrated in FIG. 6, it may be seen that voids 58 is generated in the solder 50b in the vicinity of the step formed by the body portion 92 and the insertion portion 94. When the voids 58 are generated in the solder 50b, the quality of joining is deteriorated.

Figure 7:
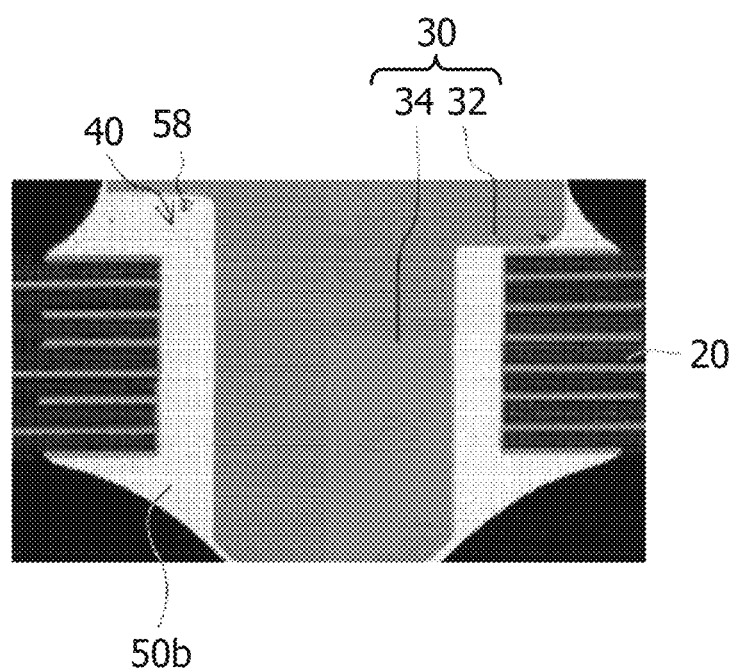
FIG. 7 is a scanning electron microscope (SEM) image in the vicinity of the joining part of the board unit according to Example 1.

FIG. 7 is a scanning electron microscope (SEM) image in the vicinity of the joining part of the board unit according to Example 1. As illustrated in FIG. 7, in Example 1, it may be seen that the generation of the void s58 is reduced in the solder 50b. It is considered that the generation of the voids 58 is reduced in Example 1 due to the following reason. That is, in the joining part 30 provided in the board unit 100 of Example 1, the notches 40, which are opened to the side surface of the body portion 32, are formed in the step surface 38 of the step 36 formed by the body portion 32 and the insertion portion 34. It is considered that the generation of the voids 58 in the solder 50b has been reduced because air permeability is improved by the notches 40 when the solder 50b is introduced into the through hole 26.

As described above, according to Example 1, as illustrated in FIG. 2, the joining part 30 joined to the board 10 and the board 20 includes the body portion 32 and the insertion portion 34. The body portion 32 is disposed between the board 10 and the board 20, and has a width larger than that of the through hole 26 in the board 20, so that the body portion 32 is not inserted into the through hole 26. The insertion portion 34 has a width smaller than that of the through hole 26 in the board 20, so that the insertion portion 34 is inserted into the through hole 26. In addition, the notches 40, which are opened to the side surface of the body portion 32, are formed in the step surface 38 of the step 36 formed by the body portion 32 and the insertion portion 34. Thus, as described above with reference to FIG. 7, the generation of the voids 58 may be reduced in the solder 50b because air permeability is improved by the notches 40. Therefore, the quality of joining may be improved. In addition, because air permeability is improved, it is possible to suppress solder scattering or the generation of solder balls, which is caused when a flux, used to increase the wettability of the solder, is volatilized by heating. In addition, from the viewpoint of improving air permeability by the notches 40, the depth of the notches 40 is preferably 0.1 mm or more, more preferably 0.3 mm or more, and most preferably 0.5 mm or more.

In addition, according to Example 1, as illustrated in FIG. 2, the notches 40 may be formed to extend from one end of the step surface 38 on the side of the side surface of the body portion 32 to the other end of the step surface 38 on the side of the side surface of the insertion portion 34. The notches 40 may be formed only in a portion of the step surface 38. However, when the notches 40 extend from one end of the step surface 38 on the side of the side surface of the body portion 32 to the other end of the step surface 38 on the side of the side surface of the insertion portion 34, the generation of the voids 58 may be effectively reduced in the solder 50b.

In addition, according to Example 1, as illustrated in FIG. 2, the notches 40 have a substantially semicircular shape when the body portion 32 is viewed from the lateral side. When the notches 40 have a substantially semicircular shape as described above, the notches 40 may be easily formed.

Figure 8A:
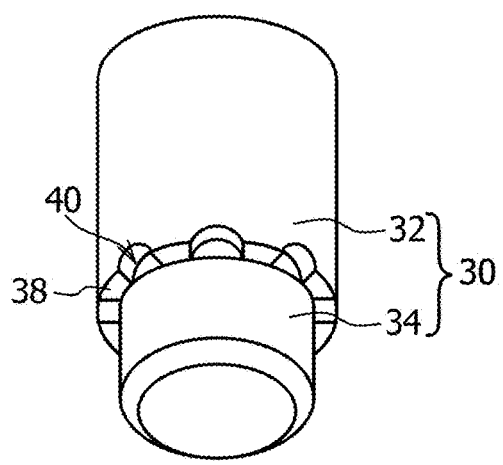
FIGS. 8A to 8D are perspective views illustrating other examples of the joining part.
Figure 8B:
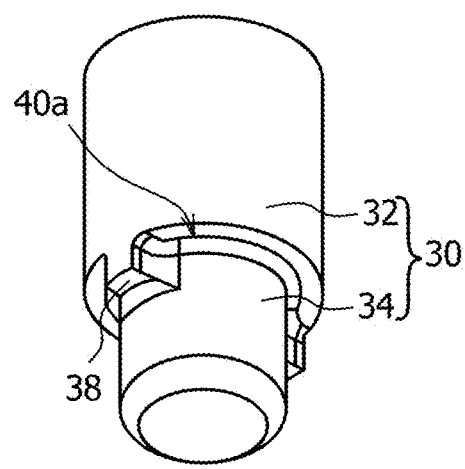

FIGS. 8A to 8D are perspective views illustrating other examples of the joining part. As illustrated in FIG. 8A, the number of notches 40 may be increased such that the notches 40 are formed in a half or more of the outer periphery of the step surface 38. By increasing the ratio of the notches 40 in the step surface 38, air permeability may be further improved. As illustrated in FIG. 8B, the entire area of the step surface 38 excluding two locations, which are opposite each other with the insertion portion 34 interposed therebetween, may be configured with notches 40a. Thereby, air permeability may be further improved. However, because the step surface 38 of the joining part 30 in which the notches 40a are not formed is placed on the board 20, stability is deteriorated. Therefore, notches may be formed at three or more locations in the step surface 38, and the portions of the step surface 38 in which no notch is formed may be arranged at regular interval.

Figure 8C:
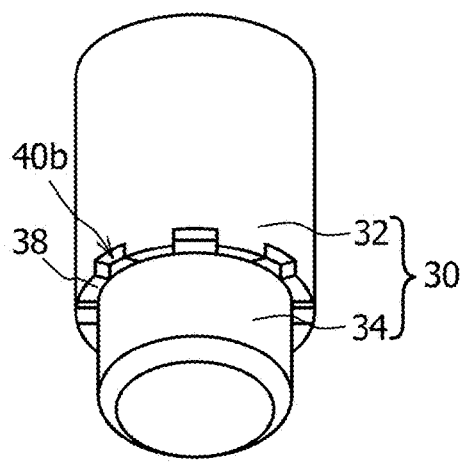
Figure 8D:
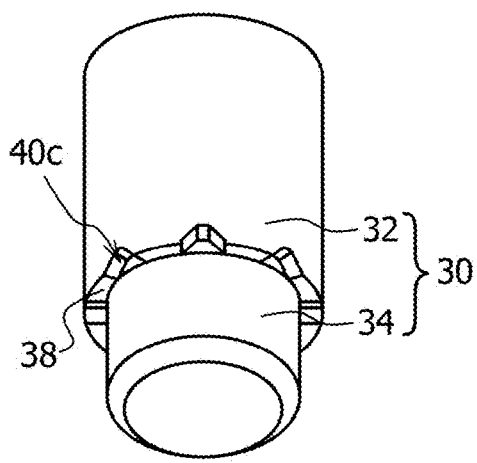

As illustrated in FIG. 8C, notches 40b may have a substantially rectangular shape when the body portion 32 is viewed from the lateral side. Here, the substantially rectangular shape includes not only a rectangular shape, but also, for example, a quadrangle shape in which corners are not right angles (for example, a quadrangle shape in which corners are rounded or have angles other than 90°). As illustrated in FIG. 8D, notches 40c may have a substantially triangular shape when the body portion 32 is viewed from the lateral side. Here, the substantially triangular shape includes not only a triangular shape, but also, for example, a triangular shape in which an apex is rounded or flattened.

Figure 9:
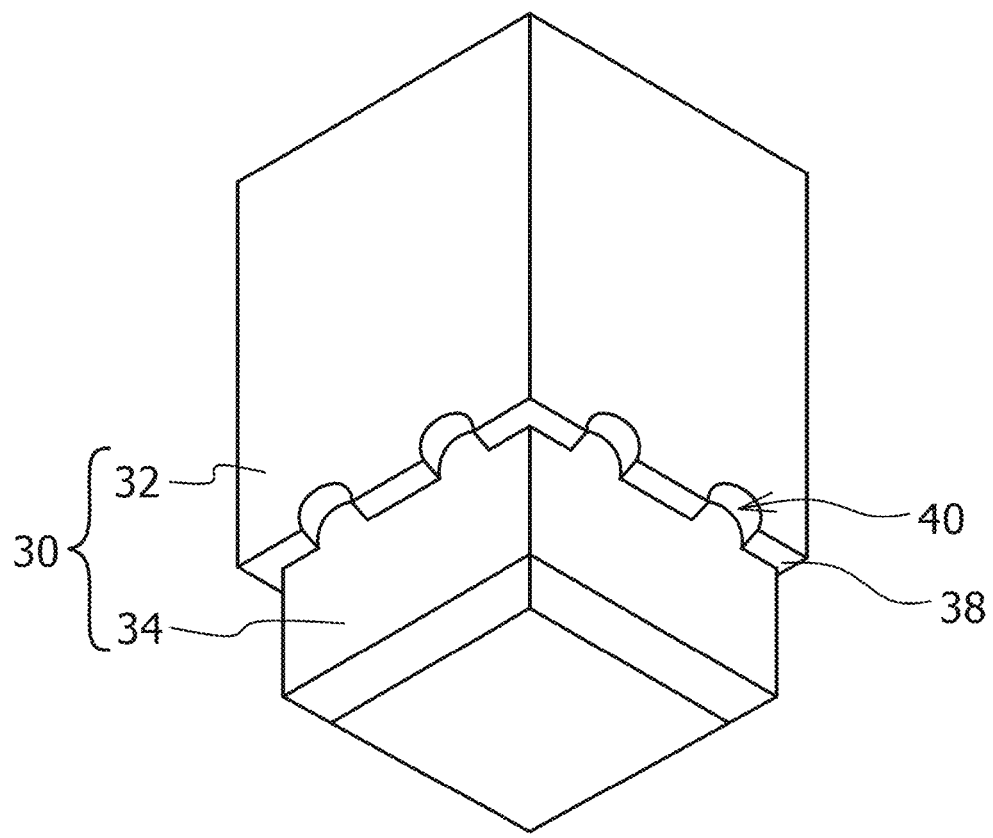
FIG. 9 is a perspective view illustrating a further example of the joining part.

In addition, according to Example 1, as illustrated in FIG. 2, the body portion 32 and the insertion portion 34 have a substantially cylindrical shape. When the body portion 32 and the insertion portion 34 have a substantially cylindrical shape as described above, the formation of the joining part 30 becomes easy. In addition, the body portion 32 and the insertion portion 34 are not limited to the case of having a substantially cylindrical shape, and may have other shapes. FIG. 9 is a perspective view illustrating a further example of the joining part. As illustrated in FIG. 9, the body portion 32 and the insertion portion 34 may have a substantially rectangular shape. Here, the substantially rectangular shape includes not only a rectangular shape, but also a quadrangle shape in which corners are not right angles (for example, a quadrangle shape in which corners are rounded or have angles other than 90°).

In addition, according to Example 1, because both the solder 50a and the solder 50b are a low melting point solder, the solder 50a and the solder 50b may be melt so as to separate the board 10 and the board 20 from each other without setting the temperature to be excessively high. That is, by separating the board 10 and the board 20 from each other while suppressing the load from being applied to the electronic elements 14, 16 and 24 due to high temperature, the electronic elements 14, 16 and 24 mounted on the board 10 and the board 20 is enabled to be replaced.

In addition, in Example 1, the width of the body portion 32 of the joining part 30 may be determined in consideration of the width and manufacturing tolerance of the through hole 26 in the board 20. In addition, the length of the body portion 32 may be determined to be equal to the distance between the board 10 and the board 20.

Figure 10:
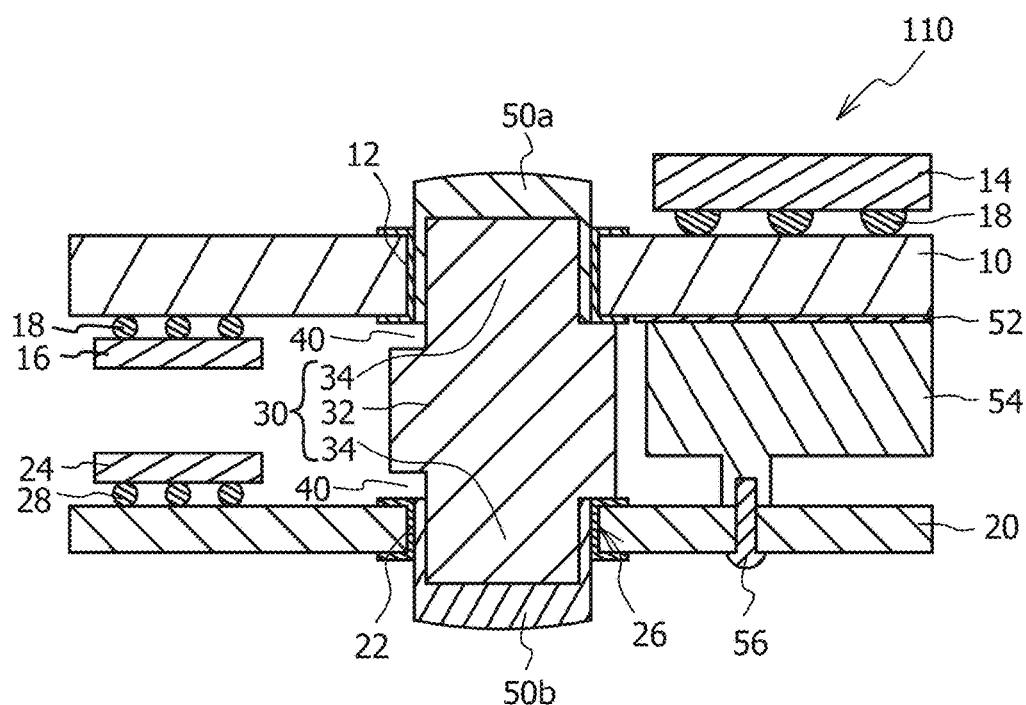
FIG. 10 is a cross-sectional view of a board unit according to Modification 1 of Example 1.

FIG. 10 is a cross-sectional view of a board unit according to a modification 1 of Example 1. As illustrated in FIG. 10, in the board unit 110 of Modification 1 of Example 1, the joining part 30 is insertion-mounted in both the board 10 and the board 20. Therefore, at opposite ends of the joining part 30, the notches 40 are formed in the step surfaces 38 of the steps 36 formed by the body portion 32 and the insertion portions 34. The other configurations are the same as those of the board unit 100 of Example 1, and thus a description thereof will be omitted.

In Example 1, although a case where one end of the joining part 30 is surface-mounted on the board 10 and the other end is insertion-mounted on the board 20 has been described by way of example, the opposite ends of the joining part 30 may be insertion-mounted on the board 10 and the board 20 as in Modification 1 of Example 1.

Example 2

Figure 11A:
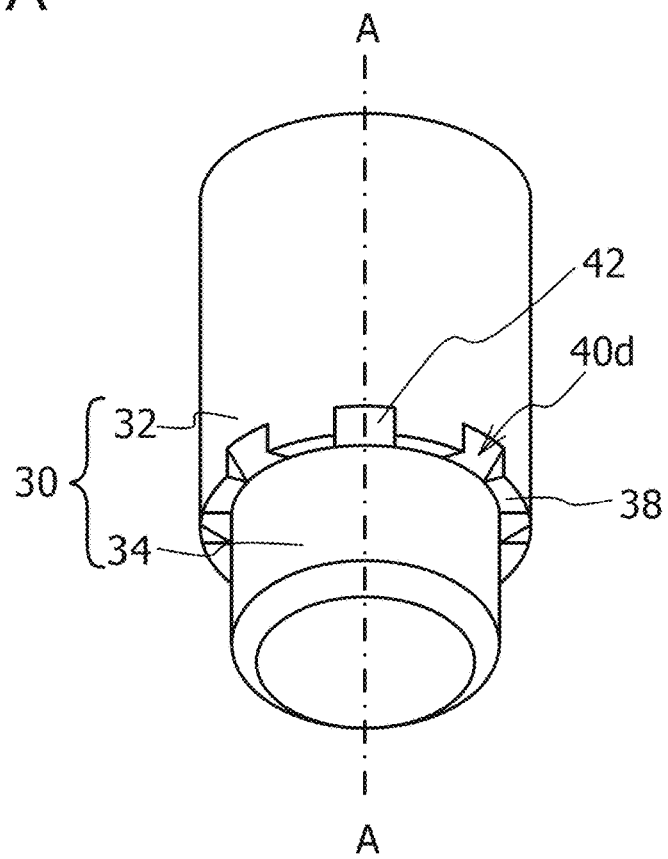
FIG. 11A is a perspective view of a joining part provided in a board unit according to Example 2.
Figure 11B:
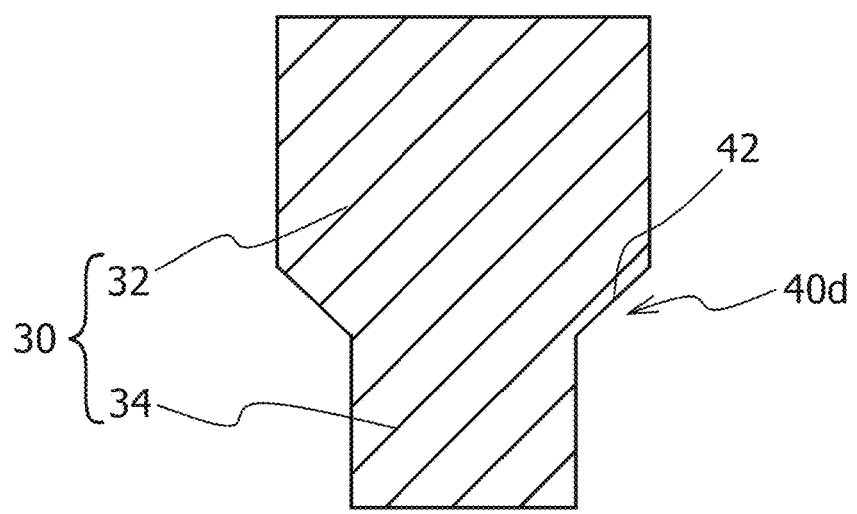
FIG. 11B is a cross-sectional view taken along line A-A of FIG. 11A.

FIG. 11A is a perspective view of a joining part provided in a board unit according to Example 2, and FIG. 11B is a cross-sectional view taken along line A-A of FIG. 11A. As illustrated in FIGS. 11A and 11B, in the joining part 30 provided in the board unit of Example 2, notches 40d formed in the step surface 38 have the shape of being obliquely cut from the step surface 38 toward the side surface of the body portion 32. That is, an inclined surface 42 of the body portion 32 that is inclined from the step surface 38 toward the side surface of the body portion 32 is exposed in the notch 40d. The other configurations of the board unit of Example 2 are the same as those of the board unit 100 of Example 1, and thus, an illustration and description thereof will be omitted.

In the case of the notches 40 of Example 1 described above with reference to FIG. 2, as illustrated in FIG. 7, a substantially right angle is formed by the body portion 32 and the insertion portion 34, and air permeability in the vicinity of the right angle becomes insufficient, which may cause the generation of the voids 58. On the other hand, in Example 2, because the notches 40d have the shape of being obliquely cut from the step surface 38 toward the side surface of the body portion 32, the angle between the body portion 32 and the insertion portion 34 becomes an obtuse angle, which may further reduce the generation of the voids 58.

In addition, in Examples 1 and 2, although descriptions have been made, as an example, with reference to a case where the board 10 and the board 20 are printed circuit boards, the joining part 30 is formed of a metal, and joining of the board 10 and the board 20 to the joining part 30 is performed by the solders 50a and 50b, the disclosure are not limited thereto. The joining part 30 may be an insulator, or joining members that join the board 10 and the board 20 to the joining part 30 may be a member other than the solder.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A joining part disposed between a first board and a second board and joined to the first board and the second board, the joining part being insertion-mounted by inserting at least one of one end and a remaining end thereof into a through hole formed in at least one of the first board and the second board, the joining part comprising:
    a body portion disposed between the first board and the second board and having a width larger than a width of the through hole;
    an insertion portion having a width smaller than the width of the through hole and inserted into the through hole;
    a stepped portion formed by the body portion and the insertion portion; and
    a notch formed to extend from one end of the stepped portion on a side of a side surface of the body portion to a remaining end of the stepped portion on a side of a side surface of the insertion portion, and the notch is opened to a side surface of the body portion.

2. The joining part according to claim 1, wherein the notch has a shape of being obliquely cut from the step surface toward the side surface of the body portion.

3. The joining part according to claim 1, wherein the notch has a substantially semicircular shape when the body portion is viewed from a lateral side.

4. The joining part according to claim 1, wherein the notch has a substantially rectangular shape when the body portion is viewed from a lateral side.

5. The joining part according to claim 1, wherein the notch has a substantially triangular shape when the body portion is viewed from a lateral side.

6. The joining part according to claim 1, wherein the body portion and the insertion portion have a substantially cylindrical shape.

7. The joining part according to claim 1, wherein the body portion and the insertion portion have a substantially rectangular shape.

8. The joining part according to claim 1, wherein the notch is formed at three or more locations in the step surface.

9. The joining part according to claim 1, wherein the body portion and the insertion portion are formed of a metal.

10. A board unit comprising:
    a first board;
    a second board; and
    a joining part disposed between a first board and a second board and joined to the first board and the second board by a joining member, the joining part being insertion-mounted by inserting at least one of one end and a remaining end thereof into a through hole formed in at least one of the first board and the second board,
    the joining part includes:
    a body portion disposed between the first board and the second board and having a width larger than a width of the through hole,
    an insertion portion having a width smaller than the width of the through hole and inserted into the through hole, the insertion portion being joined to at least one of the first board and the second board by the joining member in the through hole, a stepped portion formed by the body portion and the insertion portion, and a notch formed to extend from one end of the stepped portion on a side of a side surface of the body portion to a remaining end of the stepped portion on a side of a side surface of the insertion portion, and the notch is opened to a side surface of the body portion.

11. The board unit according to claim 10, wherein the joining part is formed of a metal, and the joining member is a solder.

\* \* \* \* \*